United States Patent
Hashimoto et al.

(10) Patent No.: US 11,177,603 B2
(45) Date of Patent: Nov. 16, 2021

(54) INTERPOSER

(71) Applicant: Tyco Electronics Japan G.K., Kawasaki (JP)

(72) Inventors: Shinichi Hashimoto, Kawasaki (JP); Hiroshi Shirai, Kawasaki (JP); Masayuki Aizawa, Kawasaki (JP)

(73) Assignee: Tyco Electronics Japan G.K., Kawasaki (JP)

( * ) Notice: Subject to any disclaimer, the term of this patent is extended or adjusted under 35 U.S.C. 154(b) by 0 days.

(21) Appl. No.: 16/937,083

(22) Filed: Jul. 23, 2020

(65) Prior Publication Data
US 2021/0028569 A1    Jan. 28, 2021

(30) Foreign Application Priority Data

Jul. 23, 2019 (JP) .............................. JP2019-135589

(51) Int. Cl.
| | |
|---|---|
| *H01R 13/24* | (2006.01) |
| *H01R 31/06* | (2006.01) |
| *H01R 13/41* | (2006.01) |
| *H01R 13/50* | (2006.01) |
| *H01R 13/646* | (2011.01) |

(52) U.S. Cl.
CPC ......... *H01R 13/2435* (2013.01); *H01R 13/41* (2013.01); *H01R 13/50* (2013.01); *H01R 31/06* (2013.01); *H01R 13/646* (2013.01)

(58) Field of Classification Search
CPC .... H01R 13/2435; H01R 13/41; H01R 13/50; H01R 13/646; H01R 31/06; H01R 12/714; H01R 33/76; H01R 13/24; H01R 13/6473; H05K 2201/0311; H05K 2201/10378; H05K 2201/10295
See application file for complete search history.

(56) References Cited

U.S. PATENT DOCUMENTS

| | | | |
|---|---|---|---|
| 6,926,536 B2 | 8/2005 | Ochiai | |
| 8,672,688 B2 | 3/2014 | Florence, Jr. | |
| 9,147,980 B2 * | 9/2015 | Chang | ................ H01R 13/6585 |
| 9,172,161 B2 | 10/2015 | Walden | |
| 10,825,791 B2 * | 11/2020 | Hashimoto | ............ H01R 33/74 |

FOREIGN PATENT DOCUMENTS

| | | |
|---|---|---|
| JP | 2004-221052 A | 8/2004 |
| JP | 2015-510684 A | 4/2015 |
| JP | 2016-503946 A | 2/2016 |

\* cited by examiner

*Primary Examiner* — Briggitte R. Hammond
(74) *Attorney, Agent, or Firm* — Barley Snyder

(57) ABSTRACT

An interposer includes a housing having a plurality of through-holes penetrating a first surface and a second surface and a signal contact pair composed of a pair of signal contacts. Each of the signal contacts includes a base portion press-fitted in one of the through-holes, a first contact beam extending from the base portion beyond the first surface, and a second contact beam extending from the base portion beyond the second surface. The pair of signal contacts are positioned adjacently to each other widthwise and are each asymmetrical with respect to a width direction. A first minimum spacing between the first contact beams of the pair of signal contacts is narrower than a second minimum spacing between the base portions of the pair of signal contacts. The signal contact pair has a plane-symmetrical shape with respect to the width direction.

7 Claims, 7 Drawing Sheets

INTERPOSER

CROSS-REFERENCE TO RELATED APPLICATION

This application claims the benefit of the filing date under 35 U.S.C. § 119(a)-(d) of Japanese Patent Application No. 2019-135589, filed on Jul. 23, 2019.

FIELD OF THE INVENTION

The present invention relates to an interposer and, more particularly, to an interposer held between two electronic components to electrically connect the electronic components.

BACKGROUND

A conventional interposer is held between two electronic components to electrically connect these electronic components. The interposer is provided with a plate-like housing having many through-holes arranged therein, and many contacts inserted in the respective ones of these many through-holes and retained in the housing.

Japanese Patent Application No. 2016-503946A discloses an interposer provided with a contact having arms with a constant width, excluding at distal ends, that extend upward and downward from a wide central portion having a plastic main body overmolded thereon.

A contact constituting an interposer has a base portion positioned within a through-hole of a housing and retained in the housing. Furthermore, the contact is provided with two contact beams extending from the base portion through a first surface and a second surface, respectively, of the housing.

These two contact beams are, for example, formed into the same shape as each other as disclosed in JP 2016-503946A. In the case of JP 2016-503946A, the two contact beams become narrower toward their distal ends, namely, they have a tapered shape. In addition, these contact beams are formed to be narrower than the base portion since the base portion must be positioned within the through-hole. Accordingly, a minimum spacing between the contacts adjacent to each other is a spacing between their base portions. However, particularly regarding a signal contact for transmitting a signal, it may be preferred that a spacing between two signal contacts adjacent to each other widthwise be made narrower than a spacing between the base portions in order to improve electrical characteristics.

SUMMARY

An interposer includes a housing having a plurality of through-holes penetrating a first surface and a second surface and a signal contact pair composed of a pair of signal contacts. Each of the signal contacts includes a base portion press-fitted in one of the through-holes, a first contact beam extending from the base portion beyond the first surface, and a second contact beam extending from the base portion beyond the second surface. The pair of signal contacts are positioned adjacently to each other widthwise and are each asymmetrical with respect to a width direction. A first minimum spacing between the first contact beams of the pair of signal contacts is narrower than a second minimum spacing between the base portions of the pair of signal contacts. The signal contact pair has a plane-symmetrical shape with respect to the width direction.

BRIEF DESCRIPTION OF DRAWINGS

The invention will now be described by way of example with reference to the accompanying Figures, of which.

DETAILED DESCRIPTION OF THE EMBODIMENT(S)

Figure 1A:
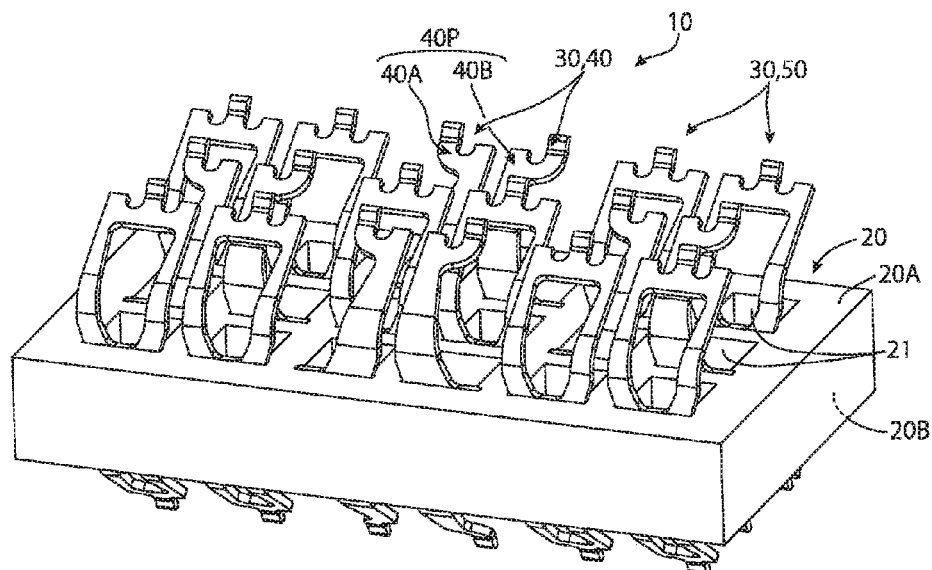
FIG. 1A is a perspective view of an interposer according to an embodiment with a first surface of a housing facing upward.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiment set forth herein; rather, these embodiments are provided so that the present disclosure will convey the concept of the disclosure to those skilled in the art.

Figure 1B:
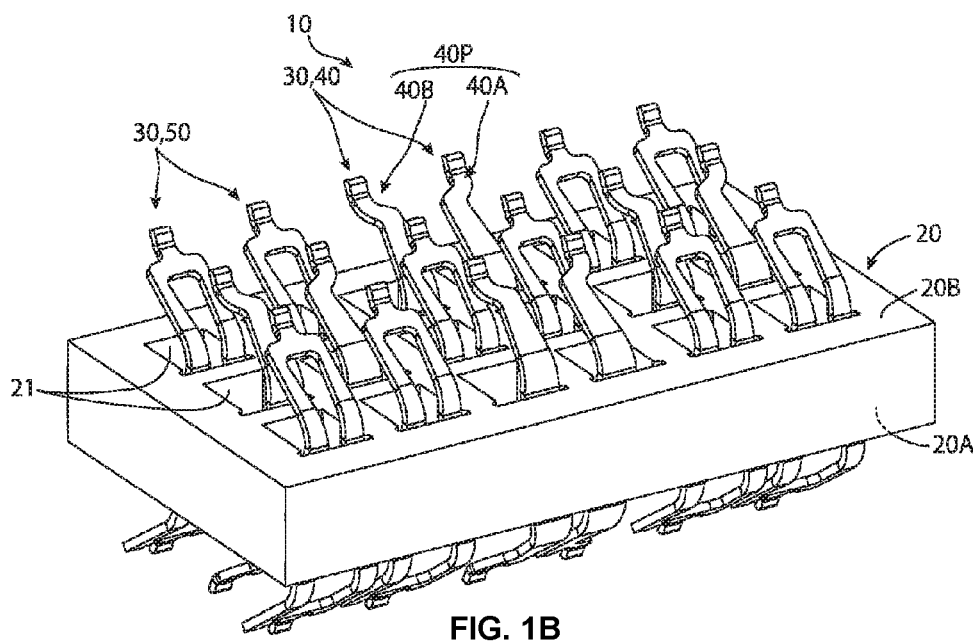
FIG. 1B is a perspective view of the interposer with a second surface of the housing facing upward.

An interposer 10 according to an embodiment is shown in FIGS. 1A and 1B. The interposer 10, as shown in FIGS. 1A and 1B, has a plate-like housing 20 and a plurality of contacts 30. Though the interposer 10 has, for example, as many as four thousand contacts 30 arranged therein, only some of them are illustrated here since the same structure is repeated.

The contacts 30 are divided into a signal contact 40 for transmitting a signal and a ground contact 50 for grounding. In addition, as the signal contact 40, there are a first signal contact 40A and a second signal contact 40B having different shapes from each other. Though the ground contact 50 differs in shape from the signal contact 40, the ground contacts 50 have the same shape as each other.

In the housing 20, as shown in FIGS. 1A, 1B, 3A, and 3B, a plurality of through-holes 21 penetrating a first surface 20A and a second surface 20B thereof and arranged in a grid array are formed. One contact 30 is press-fitted in each through-hole 21. The signal contact 40 has the first signal contact 40A and the second signal contact 40B paired and press-fitted in the through-holes 21 adjacent to each other in a width direction of the contact 30. Herein, the pair of the first signal contact 40A and the second signal contact 40B is referred to as signal contact pair 40P.

Figure 2A:
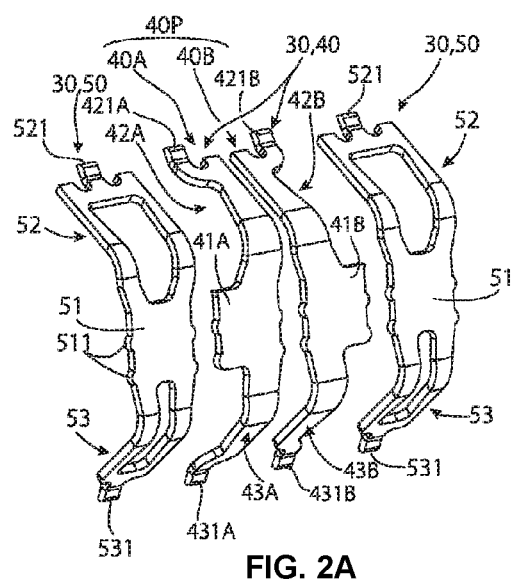
FIG. 2A is a perspective view of a plurality of contacts of the interposer.
Figures 2B, 2C:
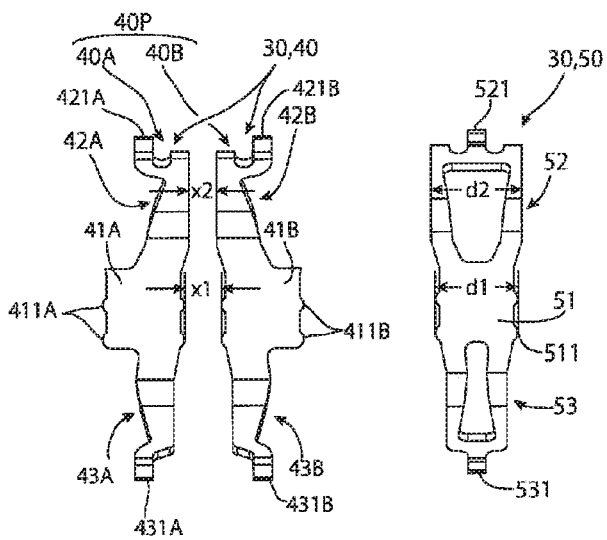
FIG. 2B is a front view of a signal contact pair of the contacts.
FIG. 2C is a front view of a ground contact of the contacts.

As shown in FIGS. 2A-2C, there are two kinds of signal contacts 40: the first signal contact 40A and the second signal contact 40B. The first signal contact 40A and second signal contact 40B are positioned adjacently to each other widthwise to constitute the signal contact pair 40P. The ground contacts 50 are positioned on both widthwise sides of the signal contact pair 40P.

Hereinafter, first, the signal contact 40 will be described. It should be noted that, in the following description, a description shared by the first signal contact 40A and the second signal contact 40B will be made with the reference signs "A", "B" for differentiating them from each other omitted.

The signal contact 40, as shown in FIGS. 2A and 2B, has a plate-like base portion 41, and a first contact beam 42 and a second contact beam 43 extending an upper end and a lower end, respectively, of the base portion 41. The base portion 41 has a press-fitting portion 411 protruding widthwise. The press-fitting portion 411 extends into an inner wall surface of the through-hole 21 when this signal contact 40 is press-fitted into the through-hole 21, to retain the signal contact 40 in the through-hole 21. The signal contact 40 is press-fitted into the through-hole 21 from the first surface 20A side of the housing 20 as to have the base portion 41 extending along one inner wall surface 211 of the through-hole 21, shown in FIGS. 3A and 3B.

As shown in FIGS. 1A-2C, the first contact beam 42 extends from the base portion 41 outward beyond the first surface 20A of the housing 20 obliquely in a thickness direction of the housing 20 to the first surface 20A. Furthermore, a first contact portion 421 is provided at an extending distal end portion of the first contact beam 42.

An unshown IC (Integrated Circuit), which is an example of a first electronic component of the present disclosure, is mounted in a position facing the first surface 20A. A connection pad for transmitting a signal, which is formed in a position corresponding to each signal contact 40, is provided on a surface facing the first surface 20A of this IC. Furthermore, once the IC is mounted, each first contact portion 421 provided at the distal end portion of each first contact beam 42 of each signal contact 40 comes into electrical contact with the connection pad. A surface of the first contact portion 421 that comes into contact with the connection pad is rounded so as to be slidable on the contact pad.

As shown in FIGS. 1A-2C, the second contact beam 43 extends from the base portion 41 outward beyond the second surface 20B of the housing 20 obliquely in the thickness direction of the housing 20 to the second surface 20B. A second contact portion 431 is provided at an extending distal end portion of the second contact beam 43.

In an embodiment, the interposer 10 is mounted on a circuit board (not shown) that is an example of a second electronic component referred to in the present disclosure, having the second surface 20B facing the circuit board. A connection pad for transmitting a signal, which is formed in a position corresponding to each signal contact 40, is provided on a surface facing the second surface 20B of this circuit board. Once the interposer 10 is mounted on the circuit board, each second contact portion 431 provided at the distal end portion of each second contact beam 43 of each signal contact 30 comes into electrical contact with the connection pad on the circuit board. That is, this interposer 10 is an interposer that mediates signal transmission between the circuit board mounted with this interposer 10 and the IC mounted on this interposer 10.

The first signal contact 40A and the second signal contact 40B constituting the signal contact pair 40P each have an asymmetrical shape with respect to the width direction. However, the signal contact pair 40P composed of the first signal contact 40A and second signal contact 40B has a plane-symmetrical (mirror image) shape with respect to the width direction. Furthermore, when a minimum spacing between the base portions 41A, 41B of the first signal contact 40A and the second signal contact 40B is x1, and a minimum spacing between the first contact beams 42A, 42B thereof is x2, the shape satisfies x1>x2, as shown in FIG. 2B.

A high speed signal is transmitted between the IC and the circuit board via the signal contacts 40A, 40B. For this high-speed signal transmission, a characteristic impedance may be lowered by positioning the signal contacts 40A, 40B in proximity.

When the signal contact 40 is press-fitted into the housing 20, the second contact beam 43 is inserted into the through-hole 21 of the housing 20 and passes through the through-hole 21, and the base portion 41 is thus press-fitted into the through-hole 21. Though the second contact beam 43 is inserted into the through-hole 21, the first contact beam 42 does not have to be inserted into the through-hole 21. For this reason, in the present embodiment, by making the spacing x2 between the first contact beams 42A, 42B narrower than the spacing x1 between the base portions 41A, 41B, the electrical characteristics are improved.

As shown in FIGS. 2A and 2C, the ground contact 50 also has, similarly to the signal contact 40, a plate-like base portion 51, and a first contact beam 52 and a second contact beam 53 extending from an upper end and a lower end, respectively, of the base portion 51. The base portion 51 is provided with a press-fitting portion 511 protruding widthwise. This press-fitting portion 511 is a portion that extends into an inner wall surface of the through-hole 21 when the ground contact 50 is press-fitted into the through-hole 21 to retain the ground contact 50 in the through-hole 21. The ground contact 50 is so press-fitted from the first surface 20A side of the housing 20 as to have the base portion 51 extending along one inner wall surface 211 of the through-hole 21.

As shown in FIGS. 1A-2C, the first contact beam 52 extends from the base portion 51 outward beyond the first surface 20A of the housing 20 obliquely in the thickness direction of the housing 20 to the first surface 20A. A first contact portion 521 is provided at an extending distal end portion of the first contact beam 52. A connection pad for grounding, which is formed in a position corresponding to each ground contact 50, is provided on a surface facing the first surface 20A of an unshown IC mounted in a position facing the first surface 20A. Furthermore, once the IC is mounted, each first contact portion 521 provided at the distal end portion of each first contact beam 52 of each ground contact 50 comes into electrical contact with the connection pad. Like the first contact portion 421 of the signal contact 40, a surface of the first contact portion 521 of this ground contact 50 is also rounded.

As shown in FIGS. 1A-2C, the second contact beam 53 extends from the base portion 51 outward beyond the second surface 20B of the housing 20 obliquely in the thickness direction of the housing 20 to the second surface 20B. Furthermore, a second contact portion 531 is provided at an extending distal end portion of the second contact beam 531.

A connection pad for grounding, which is formed in a position corresponding to each ground contact 50, is provided on a surface facing the second surface 20B of an unshown circuit board mounted with this interposer 10. Furthermore, once this interposer 10 is mounted on the circuit board, each second contact portion 531 provided at the distal end portion of each second contact beam 53 of each ground contact 50 comes into electrical contact with the connection pad on the circuit board. That is, this interposer 10 is an interposer that mediates signal transmission between the circuit board mounted with this interposer 10 and the IC mounted on this interposer 10, by way of example, as described with respect to the description of the signal contact 40.

The ground contact 50 has a shape that is bilaterally symmetrical widthwise. However, when a width d1 of the base portion 51 of the ground contact 50 and a width d2 of the first contact beam 52 thereof are compared, their relation is d2>d1, as shown in FIG. 2C. The ground contact 50, like the signal contact 40, has the second contact beam 53 inserted into the through-hole 21, and the first contact beam 52 may be of the width d2 that cannot be inserted into the through-hole 21. For this reason, by making the width d2 of the first contact beam 52 wider than the width d1 of the base portion 51, the ground contact 50 is made close to the signal contact 40.

Figure 3A:
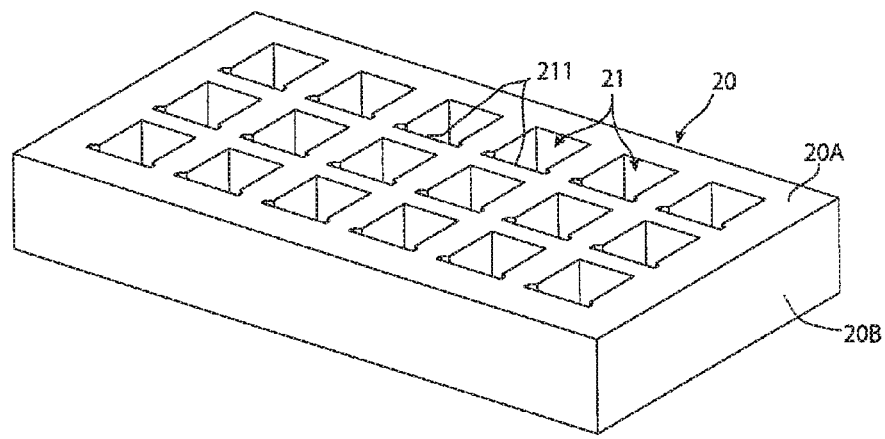
FIG. 3A is a perspective view of a housing of the interposer.
Figure 3B:
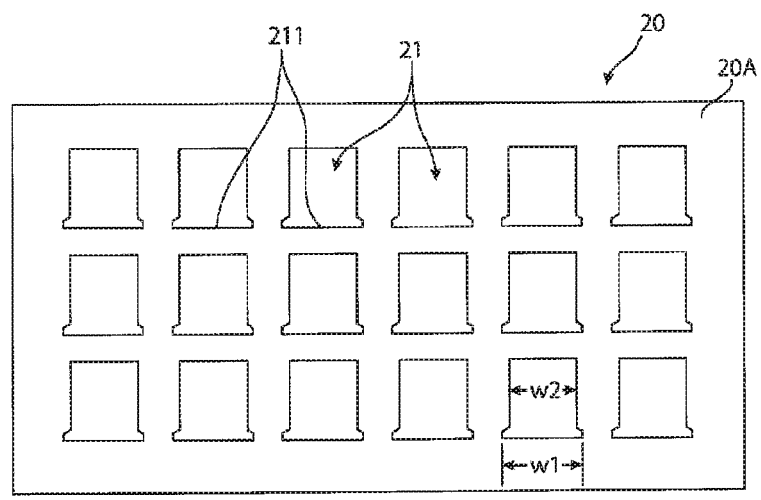
FIG. 3B is a top view of the housing.
Figure 4A:
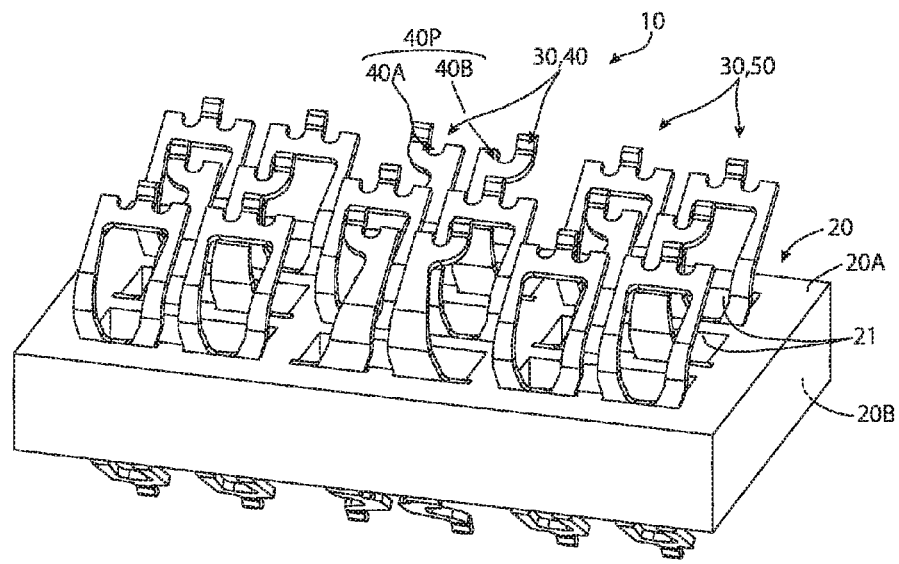
FIG. 4A is a perspective view of an interposer according to another embodiment with a first surface of a housing facing upward.
Figure 4B:
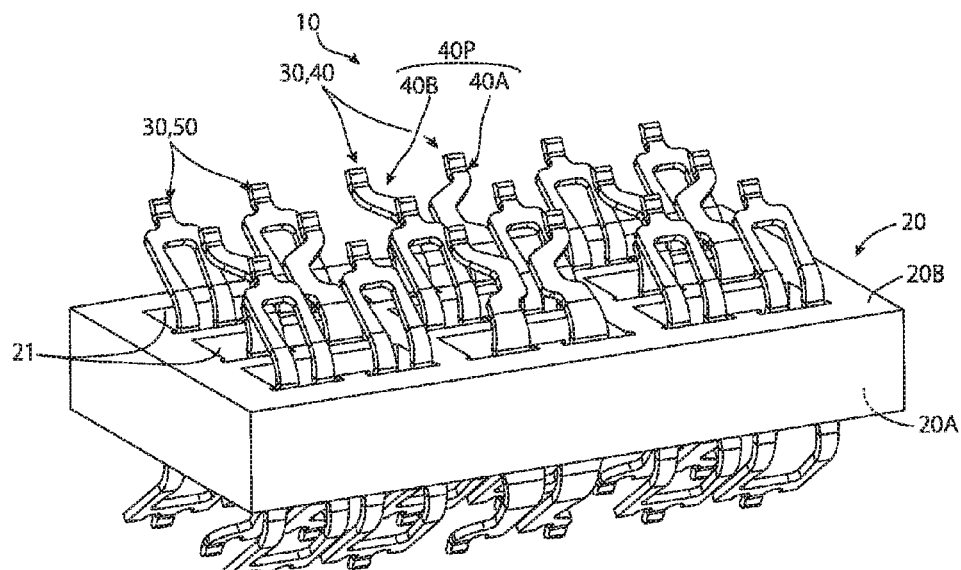
FIG. 4B is a perspective view of the interposer of FIG. 4A with a second surface of the housing facing upward.

As shown in FIG. 3B, a width w1 of the through-hole 21 along the inner wall surface 211 contacted by the press-fitted base portions 41, 51 of the through-hole 21 is wider than a width w2 of the through-hole 21 in a portion separated from the wall surface 211 thereof. This is, for both the signal contact 40 and the ground contact 50, to stabilize the positions of the base portions 41, 51 within the through-holes 21 by shaping such that the portions into which the base portions 41, 51 are press-fitted are widened to the width w1 while dimensioning such that the second contact beams 43, 53 can pass through the portions of the width w2.

As described above, in the case of this first embodiment, the first signal contact 40A and the second signal contact 40B constituting the signal contact pair 40P each have an asymmetrical shape with respect to the width direction. However, the signal contact pair 40P composed of these first signal contact 40A and second signal contact 40B has a plane-symmetrical shape with respect to the width direction. Furthermore, when a minimum spacing between the base portions 41A, 41B of the first signal contact 40A and the second signal contact 40B is x1, and a minimum spacing between the first contact beams 42A, 42B thereof is x2, the shape satisfies x1>x2. This first embodiment satisfies these shapes, thereby achieving high-speed signal transmission between the IC and the circuit board.

An interposer 10 according to another embodiment will now be described with reference to FIGS. 4A-6B. It should be noted that elements corresponding to elements of the first embodiment are denoted by the same reference signs as those shown in FIGS. 1A-3B and used in the description of the first embodiment. Therefore, a description shared with the first embodiment will be omitted.

Like the first embodiment, the first signal contact 40A and the second signal contact 40B constituting the signal contact pair 40P of the interposer 10 of this second embodiment each have an asymmetrical shape with respect to the width direction, as shown in FIGS. 4A, 4B, 6A, and 6B. However, the signal contact pair 40P composed of these first signal contact 40A and second signal contact 40B has a plane-symmetrical (mirror image) shape with respect to the width direction. Furthermore, when a minimum spacing between the base portions 41A, 41B of the first signal contact 40A and the second signal contact 40B is x1, and a minimum spacing between the first contact beams 42A, 42B thereof is x2, the shape satisfies x1>x2.

Figure 6A:
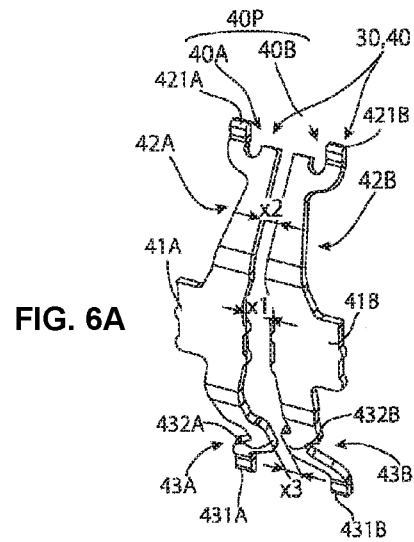
FIG. 6A is a perspective view of a signal contact pair of the interposer of FIG. 4A.

One of differences of this second embodiment from the first embodiment is that proximate portions 432A, 432B bent toward each other are formed on the second contact beams 43A, 43B, as shown in FIG. 6A. Furthermore, since the proximate portions 432A, 432B are formed, a minimum spacing x3 between the second contact beams 43A, 43B is a spacing that satisfies, when compared with the minimum spacing x1 between the base portions 41A, 41B, x1>x3.

The first signal contact 40A and the second signal contact 40B constituting the signal contact pair 40P of this second embodiment have the minimum spacing x2 between the first contact beams 42A, 42B and the minimum spacing x3 between the second contact beams 43A, 43B that are both narrower than the minimum spacing x1 between the base portions 41A, 41B. Consequently, this improves the electrical characteristics further as compared with the first embodiment.

Figure 5A:
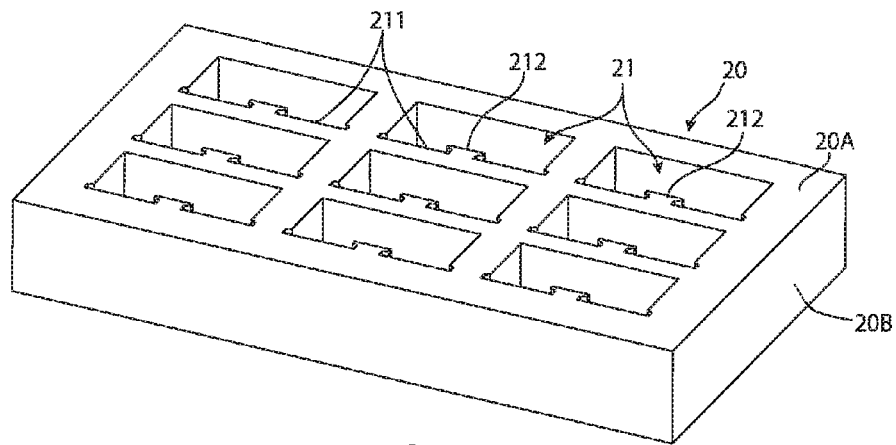
FIG. 5A is a perspective view of a housing of the interposer of FIG. 4A.
Figure 5B:
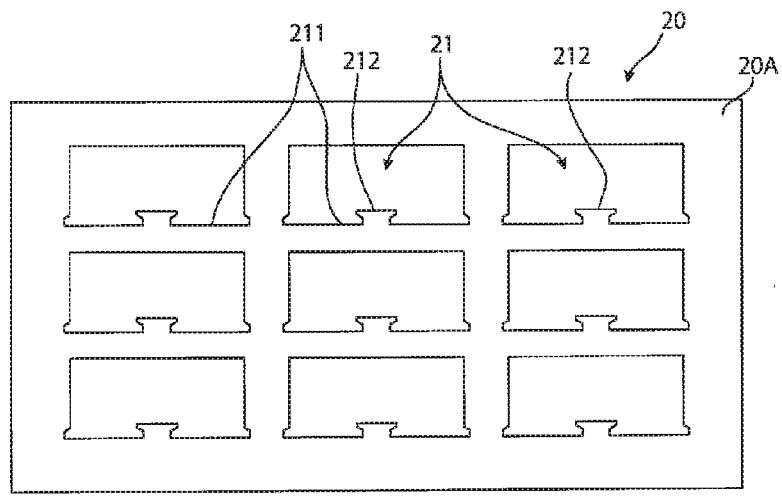
FIG. 5B is a top view of the housing of FIG. 5A.
Figure 6B:
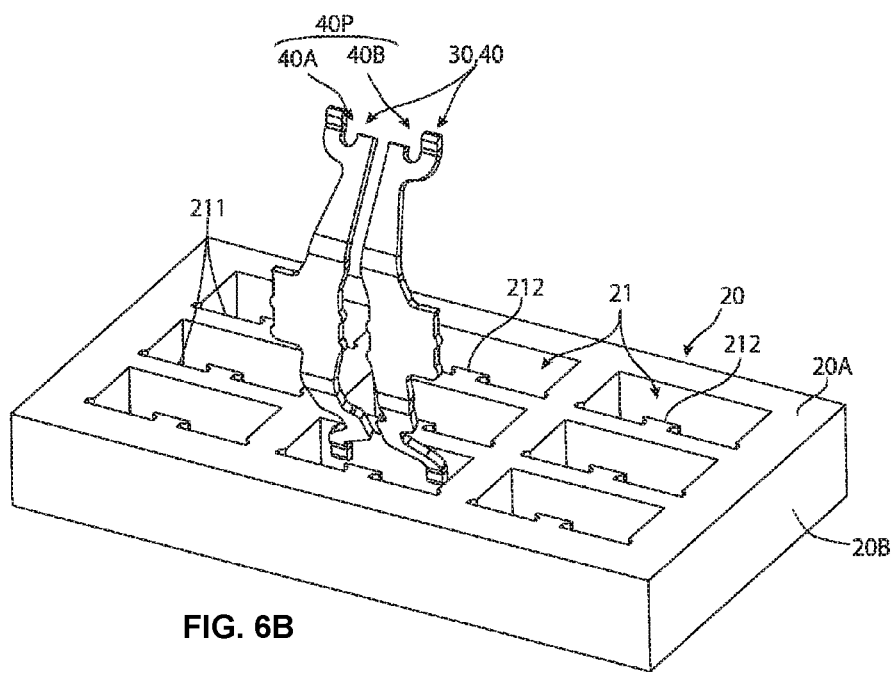
FIG. 6B is a perspective view of the signal contact pair of FIG. 6A and the housing of FIG. 5A.

Another difference of this second embodiment from the first embodiment is that the through-hole 21 having a shape described below is formed in the housing 20, as shown in FIGS. 5A, 5B, and 6B. Into the through-hole 21 in the housing 20 of this second embodiment, two signal contacts 40, namely both the first signal contact 40A and the second signal contact 40B constituting the signal contact pair 40P, are press-fitted for each through-hole 21. Also, regarding the ground contact 50, two ground contacts 50 are press-fitted for each through-hole 21. In order to allow this press-fitting of two signal contacts 40 or two ground contacts 50, the through-hole 21 is wide. In addition, on the inner wall surface 211 of each through-hole 21 along which the base portions 41, 51 extend, a separation wall 212 protruding from the inner wall surface 211 into the through-hole 21 is provided at a widthwise middle portion thereof. This separation wall 212 separates two signal contacts 40 or two ground contacts 50 press-fitted in the through-hole 21 from each other. Furthermore, the base portions 41, 51 of two signal contacts 40 or two ground contacts 50 are press-fitted to extend into the separation wall 212. That is, by providing this separation wall 212, two signal contacts 40 or two ground contacts 50 can be press-fitted into one through-hole 21.

The second contact beams 43A, 43B of the signal contacts 40A, 40B have a shape extending obliquely in the thickness direction of the housing 20. Accordingly, the proximate portions 432A, 432B are located ahead of the separation wall 212 with respect to a protruding direction of the separation wall 212, as shown in FIG. 6B. That is, the proximate portions 432A, 432B are at a location not overlapping with the separation wall 212 with respect to a thickness direction of the signal contact 40, as viewed in a perpendicular direction of the housing 20. Accordingly, at the time of press-fitting, the second contact beams 43A, 43B can pass through the through-hole 21 without interfering with the separation wall 212.

In this second embodiment, by forming the through-hole 21 into this shape and adopting the signal contact pair 40P that satisfies x1>x2 and x1>x3, the electrical characteristics are improved further.

It should be noted that, in this second embodiment, an example of press-fitting two signal contacts 40 into one through-hole 21 is shown. However, press-fitting two signal contacts 40 into one through-hole 21 is not required, and a through-hole 21 that allows passage of the proximate portions 432A, 432B is required. For example, one signal contact 40 may be press-fitted into one through-hole 21 as shown in FIGS. 3A and 3B. In this case, regarding a partition wall dividing the adjacent through-holes 21 from each other, a portion through which the proximate portions 432A, 432B pass may be so formed as to be such a thin wall as to allow passage of the proximate portions 432A, 432B.

Figure 7A:
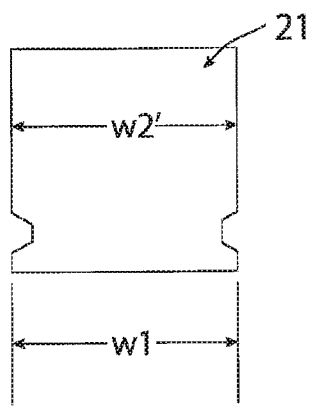
FIG. 7A is a top view of a through-hole of a housing according to another embodiment.
Figure 7B:
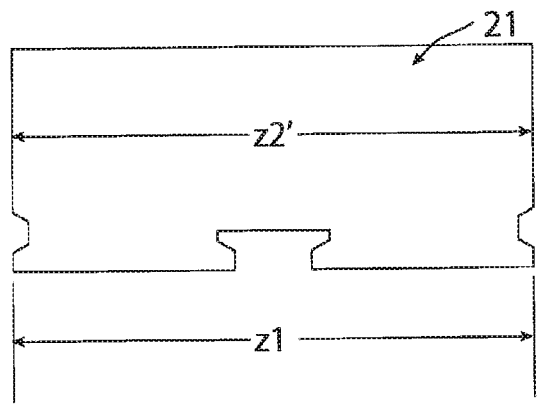
FIG. 7B is a top view of a through-hole of a housing according to another embodiment.

FIGS. 7A and 7B are diagrams illustrating modifications of the though-hole. The shape of the through-hole 21 may be set to w1=w2', as shown in FIG. 7A, in a first embodiment, or may be a shape of z1=z2', as shown in FIG. 7B, in the second embodiment.

What is claimed is:

1. An interposer held between a pair of electronic components and contacting a plurality of connection pads formed on each of the electronic components to electrically connect the electronic components, the interposer comprising:
    a housing having a first surface facing a first electronic component of the electronic components, a second surface facing a second electronic component of the electronic components, and a plurality of through-holes penetrating the first surface and the second surface; and
    a signal contact pair composed of a pair of signal contacts each including:
        a base portion press-fitted in one of the through-holes;
        a first contact beam extending from the base portion outward beyond the first surface obliquely in a thickness direction to the first surface and having at a distal end a first contact portion contacting the first electronic component; and
        a second contact beam extending from the base portion outward beyond the second surface obliquely in the thickness direction to the second surface and having at a distal end a second contact portion contacting the second electronic component, the pair of signal contacts are positioned adjacently to each other widthwise and are each asymmetrical with respect to a width direction, a first minimum spacing between the first contact beams of the pair of signal contacts is narrower than a second minimum spacing between the base portions of the pair of signal contacts, the signal contact pair has a plane-symmetrical shape with respect to the width direction.

2. The interposer of claim 1, wherein a third minimum spacing between the second contact beams of the pair of signal contacts is narrower than the second minimum spacing with respect to the width direction.

3. The interposer of claim 2, wherein the pair of signal contacts are press-fitted together in one of the through-holes.

4. The interposer of claim 3, wherein the one of the through-holes has a separation wall protruding into the through-hole from an inner wall of the through-hole.

5. The interposer of claim 4, wherein the separation wall separates the base portions of the signal contacts constituting the signal contact pair from each other.

6. The interposer of claim 5, wherein the base portions extend into the separation wall by press-fitting.

7. The interposer of claim 4, wherein a closest location of the second contact beams of the two signal contacts does not overlap with the separation wall with respect to a thickness direction of the signal contact in a perpendicular direction of the housing.

* * * * *